US010338367B2

(12) United States Patent
Araki et al.

(10) Patent No.: US 10,338,367 B2
(45) Date of Patent: Jul. 2, 2019

(54) SCANNING MICROSCOPE WITH CONTROLLED VARIABLE MEASUREMENT PARAMETERS

(71) Applicant: HITACHI, LTD., Chiyoda-ku, Tokyo (JP)

(72) Inventors: Ryoko Araki, Tokyo (JP); Hyejin Kim, Tokyo (JP); Daisuke Bizen, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 83 days.

(21) Appl. No.: 15/692,418

(22) Filed: Aug. 31, 2017

(65) Prior Publication Data

US 2018/0067294 A1 Mar. 8, 2018

(30) Foreign Application Priority Data

Sep. 2, 2016 (JP) .................................. 2016-171641

(51) Int. Cl.
*G01N 23/00* (2006.01)
*G02B 21/00* (2006.01)
(Continued)

(52) U.S. Cl.
CPC ............. *G02B 21/008* (2013.01); *G01B 9/04* (2013.01); *G02B 21/0016* (2013.01);
(Continued)

(58) Field of Classification Search
CPC .......... H01J 37/00; H01J 37/02; H01J 37/026; H01J 37/22; H01J 37/24; H01J 37/26;
(Continued)

(56) References Cited

U.S. PATENT DOCUMENTS 7,683,319 B2 * 3/2010 Makino ................. H01J 37/026
250/310
8,536,540 B2 * 9/2013 Suzuki .................. H01J 37/026
250/306
(Continued)

FOREIGN PATENT DOCUMENTS

| CN | 1453575 A | 11/2003 | |
| JP | 58133749 A | * 8/1983 | ............. H01J 37/02 |
| JP | 2006-234789 A | 9/2006 | |

OTHER PUBLICATIONS

Chinese Office Action dated Nov. 19, 2018 for CN Application No. 20170620184.5.

*Primary Examiner* — Arnel C Lavarias
(74) *Attorney, Agent, or Firm* — Miles & Stockbridge PC (57) ABSTRACT

A scanning microscope includes: a charged particle beam source configured to output a charged particle beam to be emitted to a sample; a detector configured to detect charged particles from the sample; and a controller configured to control the charged particle beam source and the detector, wherein the controller changes one or more variable parameters to determine a plurality of different parameter value sets, acquires a measurement result of a temporal change of absorption current in a target sample material under each of the plurality of different parameter value sets, and, based on the measurement results, selects a parameter value set for use in measurement of the target sample from the plurality of different parameter value sets.

12 Claims, 9 Drawing Sheets

(51) Int. Cl.
*G01B 9/04* (2006.01)
*H01J 37/26* (2006.01)
*H01J 37/28* (2006.01)

(52) U.S. Cl.
CPC ..... *G02B 21/0032* (2013.01); *G02B 21/0036* (2013.01); *G02B 21/0052* (2013.01); *H01J 37/263* (2013.01); *H01J 37/265* (2013.01); *H01J 37/28* (2013.01); *H01J 2237/022* (2013.01); *H01J 2237/244* (2013.01); *H01J 2237/2485* (2013.01)

(58) Field of Classification Search
CPC ...... H01J 37/261; H01J 37/30; H01J 37/3002; H01J 37/3005; H01J 37/3007; H01J 37/302; H01J 37/304; H01J 2237/00; H01J 2237/02; H01J 2237/0206; H01J 2237/022; H01J 2237/0225; H01J 2237/245; H01J 2237/26; H01J 2237/2602; H01J 2237/2809

USPC ........ 359/362, 363, 368, 369; 250/306, 307, 250/310, 311, 315.3, 200, 201.1, 549, 250/205, 206, 207, 215, 396 R, 397, 398, 250/399, 400, 396 ML, 492.1, 492.2, 250/492.21, 492.22, 492.23, 492.3

See application file for complete search history.

(56) References Cited

U.S. PATENT DOCUMENTS

| | | | |
|---|---|---|---|
| 8,772,735 B2* | 7/2014 | Kasuya | H01J 37/073 250/423 F |
| 9,202,665 B2* | 12/2015 | Matsui | H01J 37/026 |
| 2006/0022295 A1* | 2/2006 | Takafuji | H01L 22/14 257/495 |
| 2009/0166557 A1 | 7/2009 | Makino et al. | |

* cited by examiner

| SAMPLE MATERIAL | PARAMETER VALUE SET ||| ABSORPTION CURRENT MEASUREMENT DATA |
| --- | --- | --- | --- | --- |
| | MAGNIFICATION | SCAN SPEED | ACCELERATION VOLTAGE | PROBE CURRENT |
| Si (PLATE) | X100000 | 10 sec | 1000 eV | 50 pA | xxxxxxxxxxxxxxxxx |
| Si (PLATE) | X110000 | 10 sec | 1000 eV | 50 pA | xxxxxxxxxxxxxxxxx |
| ... | ... | ... | ... | ... | ... |

311 / 312 / 313

DATABASE 113

SCANNING MICROSCOPE WITH CONTROLLED VARIABLE MEASUREMENT PARAMETERS

CLAIM OF PRIORITY

The present application claims priority from Japanese patent application JP 2016-171641 filed on Sep. 2, 2016, the content of which is hereby incorporated by reference into this application.

BACKGROUND OF THE INVENTION

1. Field of the Invention

The present invention relates to a scanning microscope.

2. Description of the Related Art

In electronics fields such as a semiconductor, there is a tendency toward a yearly decrease of a device size, and acquiring information on a top surface is important. One of methods for observing the top surface that can be raised is a scanning electron microscope (SEM). The SEM is a charged particle beam apparatus that does scanning with use of a primary charged particle beam, detects signal charged particles emitted from a sample, and forms an image with use of signals of the detected signal charged particles, and the primary charged particle beam and the signal charged particles are electrons.

The SEM has higher spatial resolution than an optical microscope. However, when the SEM scans the top surface of the sample with use of the primary charged particle beam for a predetermined period of time, the surface may look dark, or the image may look blurred. This phenomenon occurs because contamination attaches to the surface as high as several nm, which is an obstacle in the observation.

One method for avoiding attachment of the contamination is to set a sample chamber in a high vacuum state (for example, about $10^{-10}$ torr). Another method is to remove the attached contamination by means of a plasma cleaner.

JP-2006-234789-A discloses the following (summary). "As a means to solve charge non-uniformity caused by non-uniformity of electron irradiation density, electrons to be irradiated and a sample are relatively moved to average the electron irradiation density. Also, as a means to monitor charge on the surface of the sample in real time, absorption current flowing in the sample and the number of secondary electrons and reflection electrons emitted from the sample are measured."

SUMMARY OF THE INVENTION

The conventional method for setting a sample chamber in a high vacuum state (for example, about $10^{-10}$ torr) requires large-scale vacuum unit and gas introduction unit. The conventional method for removing contamination attached to the surface of a sample may destroy a surface state of the sample to be observed (to be measured). JP-2006-234789-A only discloses a method for monitoring a charge state and does not disclose or suggest a method for decreasing an influence of the contamination on an observation image or measurement data.

A representative example of the present invention is a scanning microscope including: a charged particle beam source configured to output a charged particle beam to be emitted to a sample; a detector configured to detect charged particles from the sample; and a controller configured to control the charged particle beam source and the detector, wherein the controller changes one or more variable parameters to determine a plurality of different parameter value sets, acquires a measurement result of a temporal change of absorption current in a target sample material under each of the plurality of different parameter value sets, and, based on the measurement results, selects a parameter value set for use in measurement of the target sample from the plurality of different parameter value sets.

According to an aspect of the present invention, in a scanning microscope, a condition for decreasing an influence of contamination on a sample can be set.

DESCRIPTION OF THE PREFERRED EMBODIMENTS

Hereinbelow, an embodiment of the present invention will be described with reference to the attached drawings. It is to be noted that the embodiment is illustrative only to carry out the present invention and does not limit a technical scope of the present invention. Common components are shown with the same reference numerals in the drawings.

The present embodiment relates to an apparatus configured to observe, test, or measure a sample with use of a charged particle beam. A scanning microscope according to the present embodiment measures a temporal change of absorption current in the sample under different values of a variable parameter in an irradiation condition for the charged particle beam and determines an appropriate value of the variable parameter based on measurement results. Accordingly, in observing, testing, or measuring the sample, an influence of contamination attached to the sample is decreased.

Hereinbelow, a scanning electron microscope to which the present invention has been applied will be described. A technique of the present embodiment can be applied to another kind of scanning microscope such as an electron microscope, an ion microscope, and a testing apparatus.

First Embodiment

Figure 1:
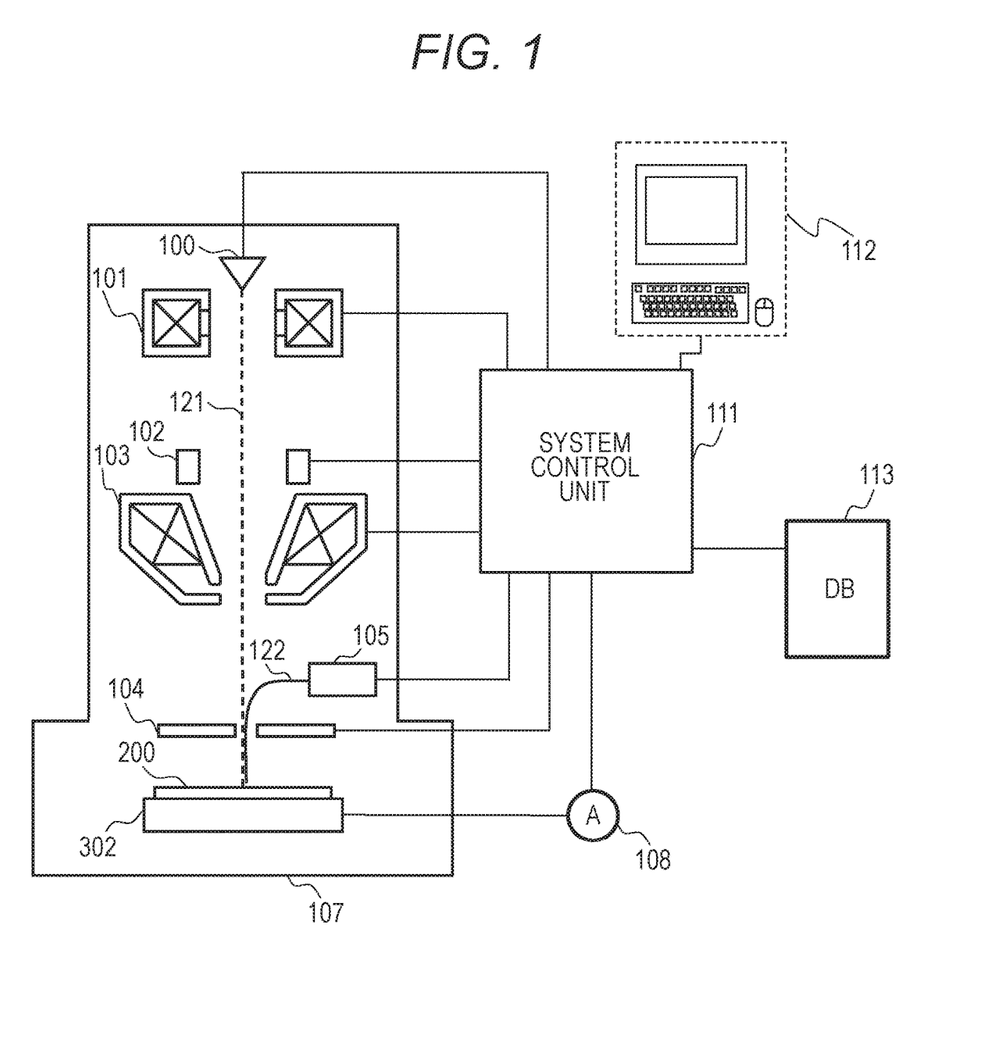
FIG. 1 illustrates an entire configuration example of a scanning electron microscope.

FIG. 1 illustrates an entire configuration example of a scanning electron microscope. The scanning electron microscope includes in a sample chamber 107 an electron gun 100, a condenser lens 101, a scanning deflector 102, an objective lens 103, an aperture 104, a detector 105, and a sample stage 302. The sample chamber 107 is depressurized by a not-illustrated pump. A sample 200 is fixed on the sample stage 302. The scanning electron microscope also includes an ammeter 108 configured to measure absorption current in the sample 200.

The scanning electron microscope includes a system control unit 111. The system control unit 111 processes detection signals and controls the respective components of the scanning electron microscope. The system control unit 111 includes an input/output device to receive operations of a user and provide the user with measurement results. In the present embodiment, the system control unit 111 measures absorption current in the sample with use of different values of a variable parameter and determines an appropriate value of the variable parameter based on measurement results.

The system control unit 111 includes a processor operated in accordance with a control program, a memory configured to store the control program and setting data, interface configured to control optical elements of the scanning electron microscope, and interface configured to communicate with a database (DB) 113 and a user terminal 112, for example.

The processor communicates with the user terminal 112 to receive instructions and parameters for controlling the scanning electron microscope and controls the optical elements of the scanning electron microscope in accordance with the instructions and parameters. The processor acquires required data from the DB 113 and stores specific data in the DB 113. In the present embodiment, the DB 113 stores data of a temporal change of absorption current under different parameter value sets.

Each of the user terminal 112 and the DB 113 has a typical computer configuration, for example. For example, the user terminal 112 includes a processor, a memory, interface configured to communicate with the system control unit 111, and an input device and an output device operated by the user.

An overview of operations of the scanning microscope will be described. The electron gun 100 installed at the upper part of the microscope body outputs a primary electron beam 121. The electron gun 100 is a charged particle beam source. The primary electron beam 121 passes through the condenser lens 101, the scanning deflector 102, the objective lens 103, the aperture 104, and the like to be condensed and deflected. The condensed and deflected primary electron beam 121 is emitted to a measurement position of the sample 200 arranged on the sample stage 302.

The primary electron beam 121 emitted to the sample 200 interacts with substances in the vicinity of the surface of the sample 200, and secondary electrons, reflection electrons, and the like are generated depending on the shape and the material of the sample 200 and become signals to be acquired. Hereinbelow, in the present embodiment, these electrons are collectively referred to as secondary electrons.

A part 122 of the generated secondary electrons is detected by the detector 105. The system control unit 111 scans the sample 200 with use of the primary electron beam 121 by means of the scanning deflector 102. The amount of detection signals changes depending on the irradiation position of the primary electron beam 121. The system control unit 111 creates an image based on brightness to acquire a SEM (Scanning Electron Microscope) image. The SEM image acquired is displayed on the user terminal 112.

A part of the primary electron beam 121 emitted to the sample 200 is absorbed in the sample 200. The ammeter 108 measures current (also referred to as substrate current) flowing in the sample stage 302 from the sample 200 to measure absorption current in the sample 200. Meanwhile, the absorption current can also be measured by measuring the secondary electrons.

The system control unit 111 acquires measurement values of the ammeter 108 and estimates a contamination forming state from a temporal change of the absorption current. The system control unit 111 analyzes the temporal change of the absorption current under different parameter values and determines an appropriate parameter value. The system control unit 111 outputs the temporal change of the absorption current or the analysis result to the user terminal 112 as needed. The system control unit 111 records data of the temporal change of the absorption current and a parameter value set at the time of the measurement in the DB 113.

Meanwhile, in the present specification, elements that have an effect on the charged particle beam such as an electron source, a lens, an aligner, and a detector are collectively referred to as optical elements. The optical elements are controlled by the system control unit 111. The user can check and change setting of the respective optical elements with use of the user terminal 112.

Figure 2:
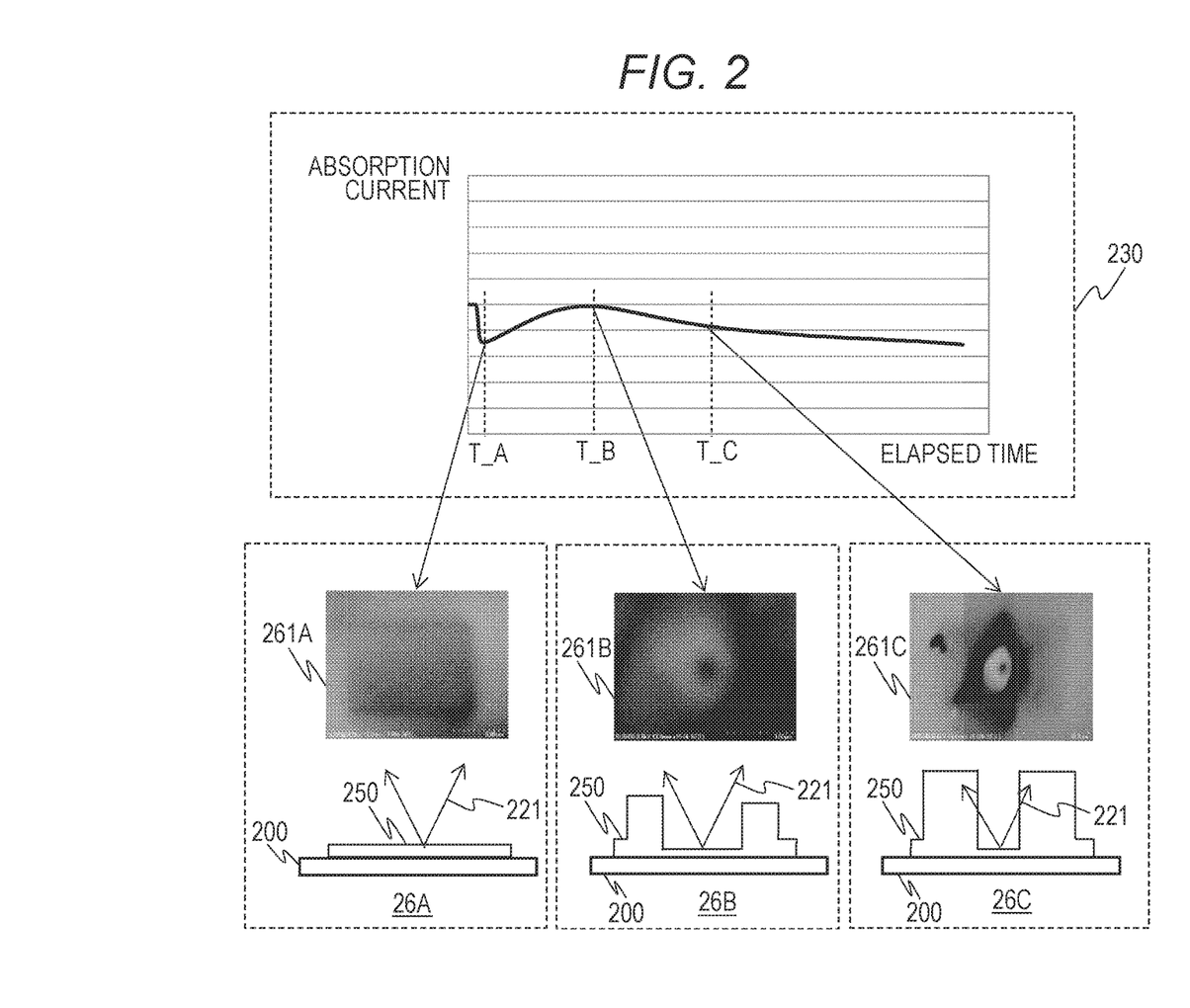
FIG. 2 illustrates an example of relationship between absorption current and a state of contamination on a sample.

Referring to FIG. 2, relationship between the absorption current in the sample and the contamination state will be described. FIG. 2 illustrates an example of relationship between the absorption current and the state of contamination 250 on the sample 200.

A graph 230 illustrates an example of a temporal change of the absorption current in the sample 200 kept irradiated with the primary electron beam. The value of the absorption current is negative, and a lower value represents the larger amount of current (absolute value). A section 26A shows a SEM image 261A at elapsed time T_A and a schematic view of a state of the contamination 250 on the sample 200.

A section 26B shows a SEM image 261B at elapsed time T_B and a schematic view of a state of the contamination 250 on the sample 200. A section 26C shows a SEM image 261C at elapsed time T_C and a schematic view of a state of the contamination 250 on the sample 200.

As shown in the section 26A, at the elapsed time T_A, which is an initial stage of irradiation of the sample 200 with the primary electron beam, the contamination 250 attaches to a part irradiated with the primary electron beam, and the amount of the absorption current increases (in the graph 230, the value of the absorption current goes downward).

When the sample 200 is kept irradiated with the primary electron beam, as shown in the section 26B, at the area of the surface of the sample 200 irradiated with the primary electron beam, the contamination 250 increasingly attaches, and the contamination 250 is partially removed due to a milling effect exerted by the primary electron beam. Consequently, the amount of the absorption current (absolute value) decreases (in the graph 230, the value of the absorption current goes upward). At the elapsed time T_B, the absorption current shows a maximum value (minimum value of the amount of the absorption current).

When the sample 200 is further kept irradiated with the primary electron beam, as shown in the section 26C, the contamination 250 around the area irradiated with the primary electron beam remains without being removed, and the remaining part forms a frame. As a result, secondary electrons 221 emitted from the sample 200 are absorbed into the frame-like contamination 250, and the amount of the absorption current increases. The absorption current thereafter shows an approximately constant value.

As described above, the amount of the absorption current in the sample changes in accordance with attachment and removal of the contamination along with the elapse of irradiation time with the primary electron beam. The contamination consists of elements of low atomic number such as carbon. As a result of attachment of the contamination, the amount of the secondary electrons decreases while the amount of the absorption current increases.

The scanning electron microscope according to the present embodiment utilizes the temporal change of the contamination as a result of irradiation with the primary electron beam and the corresponding temporal change of the absorption current. By analyzing the temporal change of the absorption current, the scanning electron microscope determines an appropriate primary electron irradiation condition less influenced by contamination.

In an example described below, a primary electron irradiation condition includes a plurality of variable parameters. Specifically, the variable parameters are magnification, scan speed, acceleration voltage, and probe current. These are important parameters in observation with use of the microscope, and setting these parameters appropriately enables an appropriate observation condition to be set. Some of these parameters may be the variable parameters, and the variable parameters may include other variable parameters.

The scanning electron microscope selects one or more variable parameters from the four variable parameters in accordance with user setting. This enables parameters that the user regards as important to be set to appropriate values. Values of the unselected variable parameters are fixed.

The scanning electron microscope analyzes measurement results of the temporal change of the absorption current under different values of one or more variable parameters selected. The measurement results are new measurement results or previous measurement results stored in the DB 113. The scanning electron microscope determines for sample observation a value of one or more variable parameters selected based on the measurement results.

Figure 3:
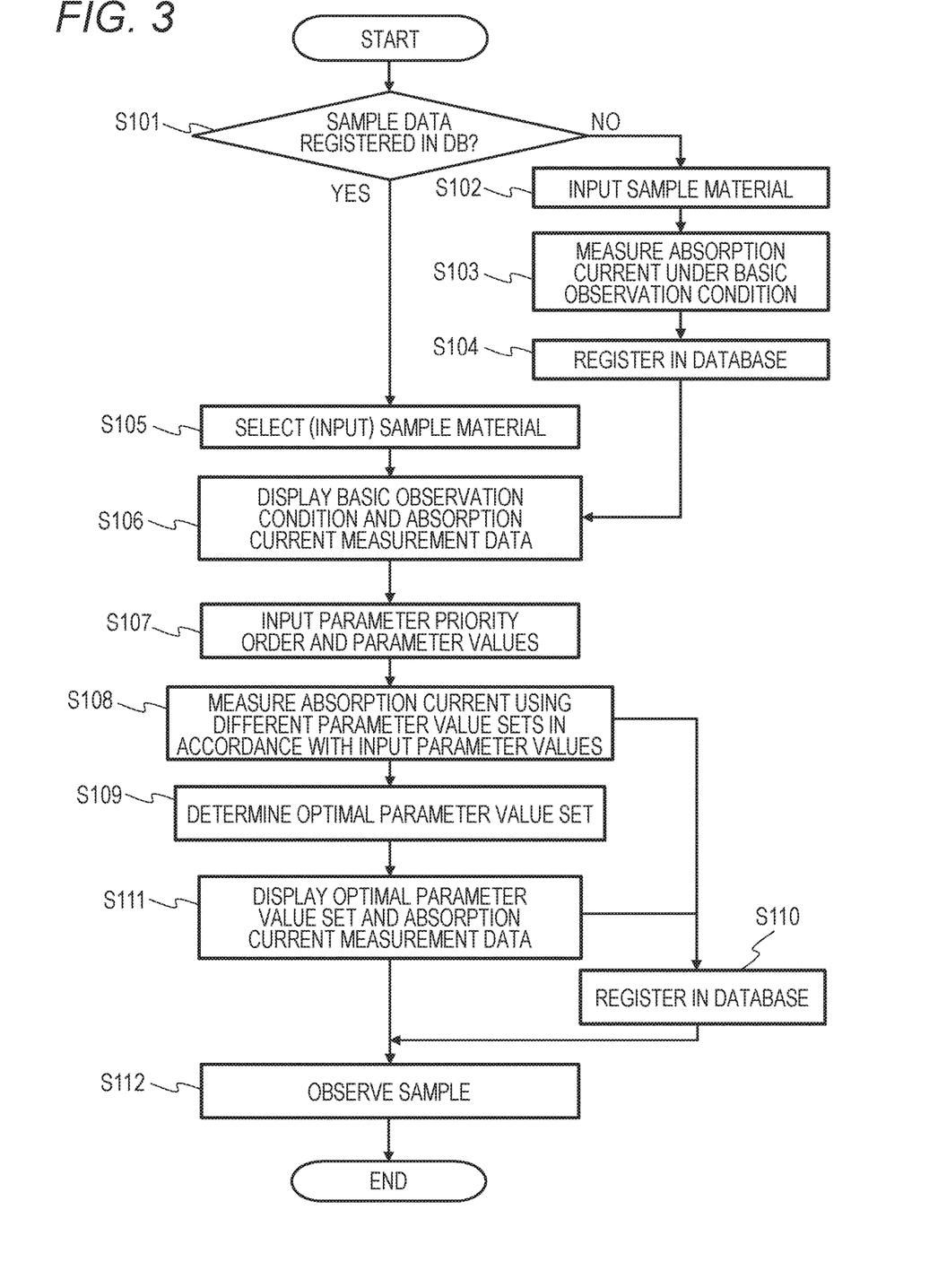
FIG. 3 is a flowchart for determining a primary electron beam irradiation condition (observation condition) of the scanning microscope.

Hereinbelow, a specific procedure for setting an observation condition will be described. FIG. 3 is a flowchart for determining a primary electron beam irradiation condition (observation condition) of the scanning microscope. The user arranges the target sample 200 on the sample stage 302. The user operates the user terminal 112 to check whether or not data of the sample 200 targeted for observation is registered in the database 113 (S101).

Figure 4:
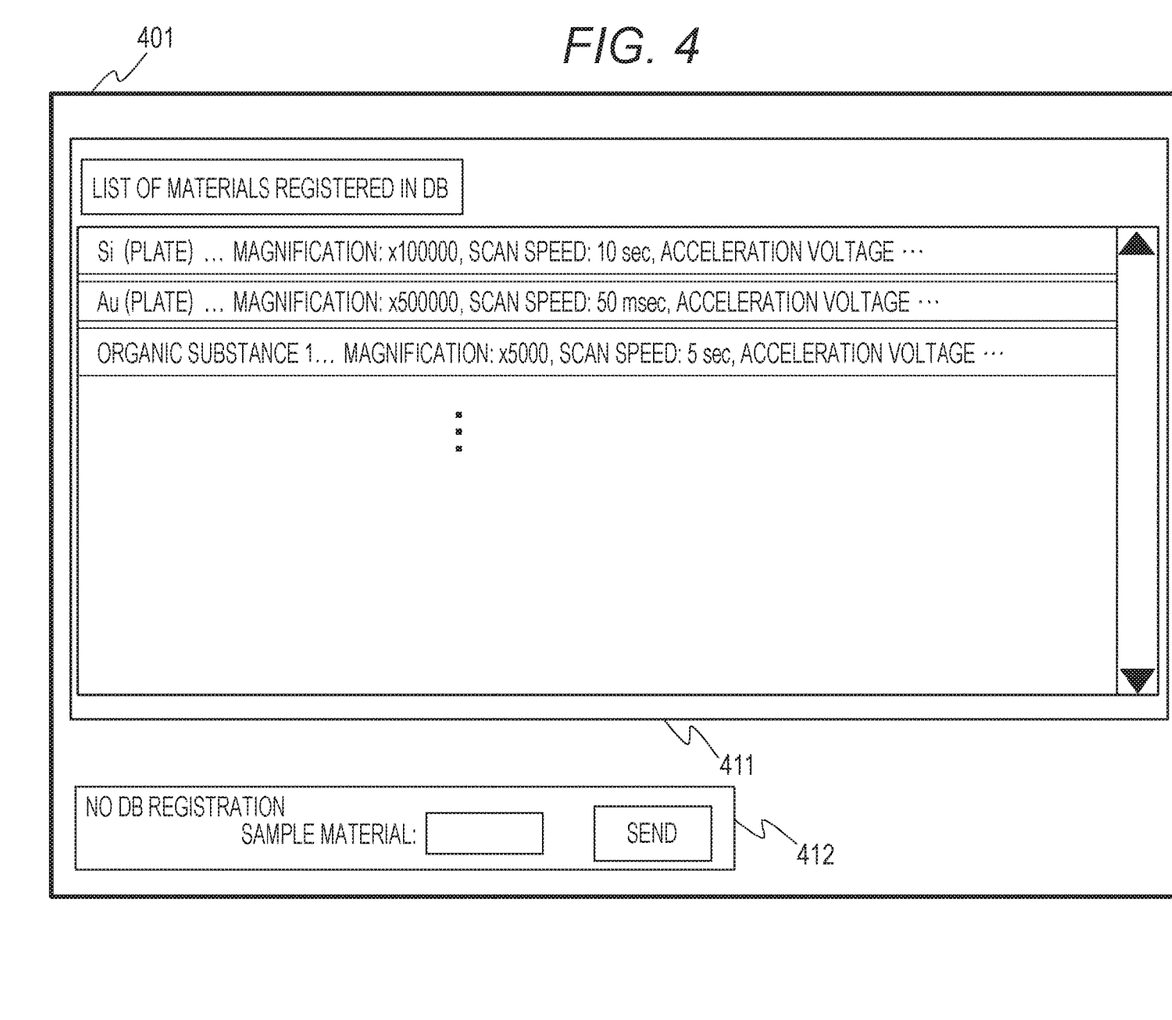
FIG. 4 illustrates a GUI image, displayed on a user terminal, of a list of materials each of whose data is registered in a database.

FIG. 4 illustrates a GUI image 401, displayed on the user terminal 112, of a list of materials each of whose data is registered in the database 113. The GUI image 401 includes a list 411 of materials each of whose data is registered in the database 113 and a section 412 in which the user is to input a sample name in a case in which a target sample kind is not registered in the database 113. The system control unit 111 transmits the data of the GUI image 401 to the user terminal 112 in accordance with a request from the user.

The material list 411 shows a name and a basic observation condition of each material. The basic observation condition is a basic parameter value set. In the present embodiment, the basic parameter value set includes values of magnification, scan speed, acceleration voltage, and probe current. The user can check if a target material is included by referring to the material list 411 of the GUI image 401.

Figure 5:
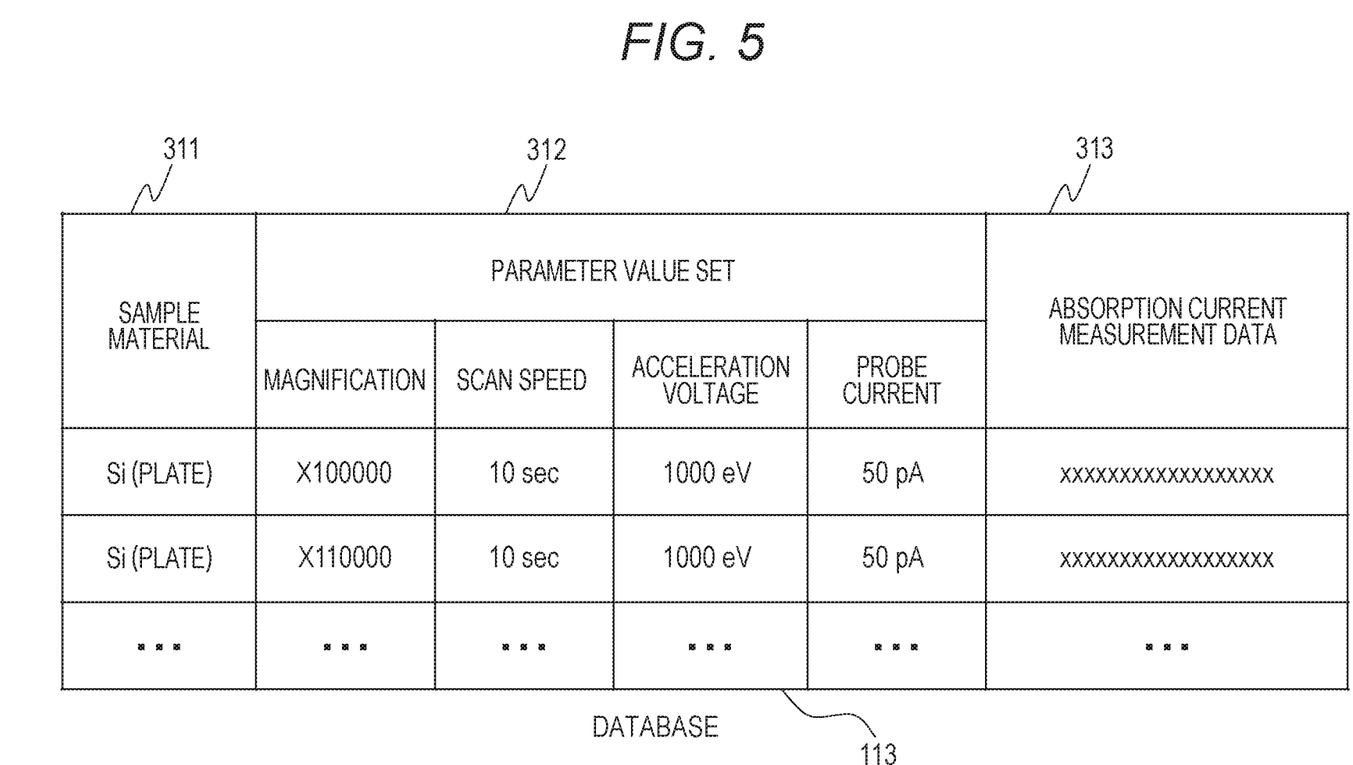
FIG. 5 illustrates a configuration example of the database.

FIG. 5 illustrates a configuration example of the database 113. The database 113 manages measurement data of a temporal change of absorption current in sample materials under different parameter value sets. The database 113 includes a sample material column 311, a parameter value set column 312, and an absorption current measurement data column 313.

The parameter value set column 312 shows values of magnification, scan speed, acceleration voltage, and probe current, which are variable parameters. The scan speed is expressed by scan time per frame (field of view).

The absorption current measurement data column 313 has stored therein measurement data of a temporal change of absorption current as illustrated in FIG. 2. The database 113 of the measurement data of the absorption current enables measurement time of the absorption current for determining an optimal observation condition to be shortened.

The database 113 can also support setting of an observation condition performed by the user. Data in the database 113 may include measurement data for determining an observation condition based on the user's instruction and measurement data registered when the scanning electron microscope is manufactured as described below. Meanwhile, the database 113 may have any configuration as long as the database 113 has stored therein necessary data. The database 113 may be omitted. The system control unit 111 may use only a measurement result in the database 113 without performing actual measurement.

Returning to FIG. 3, in a case in which data of the observation target sample is not registered in the database 113, that is, the material list 411 does not include the target material (S101: NO), the user operates the user terminal 112 to input a material name of the target sample in the section 412 and select a send button (S102). The system control unit 111 receives the material name of the target sample from the user terminal 112.

Figure 6A:
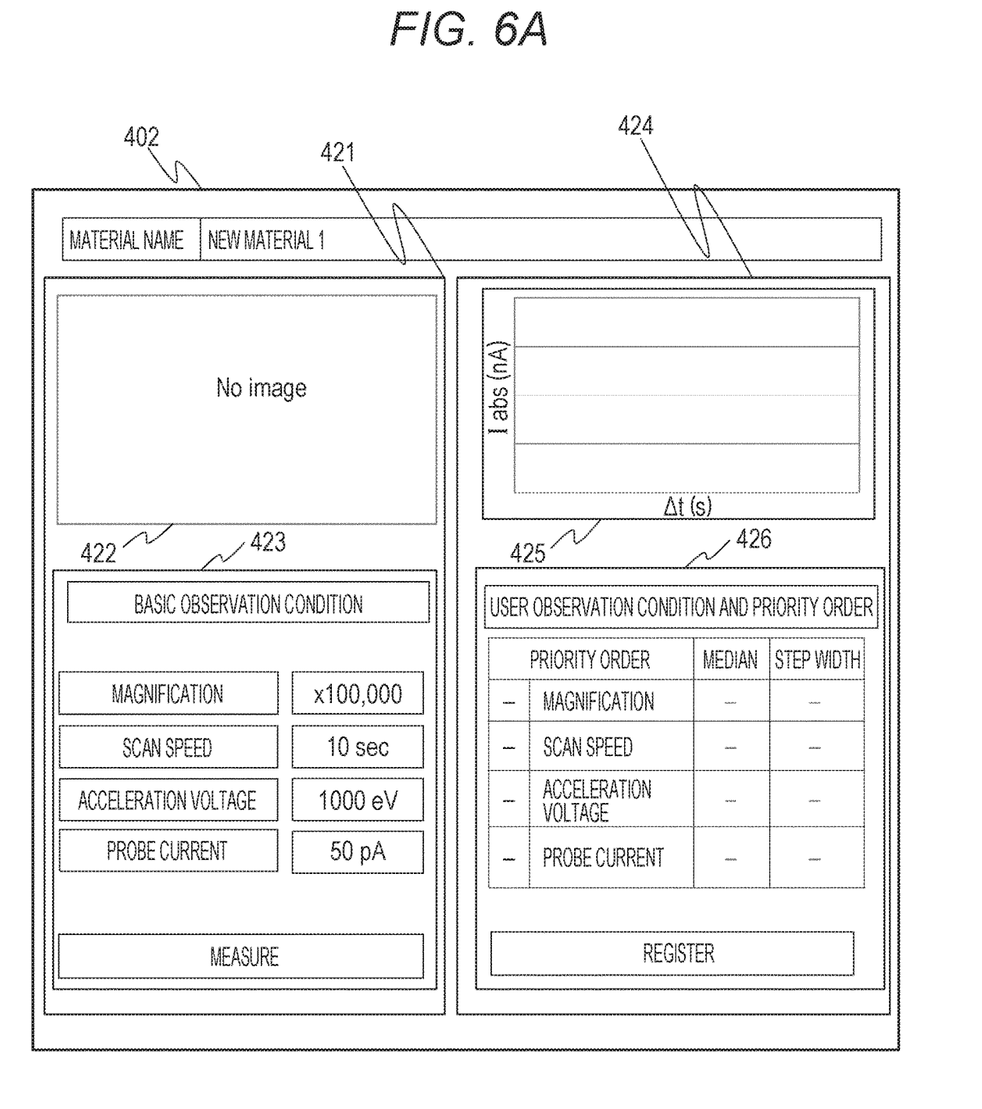
FIG. 6A illustrates an example of a GUI image for determining the observation condition.

The system control unit 111 displays a GUI image illustrated in FIG. 6A on the user terminal 112. In a window 402, a database data section 421 shows data registered in the database 113. In the database data section 421, a measurement data section 422 shows measurement data of a temporal change of absorption current.

A condition section 423 shows a preset basic observation condition, which is an apparatus condition at the time of measurement. In the present embodiment, the condition section 423 shows a set of preset magnification value, scan speed value, acceleration voltage value, and probe current value.

A measurement result display section 424 shows newly measured data of a temporal change of absorption current. In the measurement result display section 424, a measurement data section 425 shows measurement data of a temporal change of absorption current to be acquired newly. An observation condition section 426 accepts input of a condition for measuring a temporal change of absorption current by the user.

FIG. 6A is an image example in a case in which data of an observation target sample is not registered in the database 113. Thus, the database data section 421 provides data only in the condition section 423. The measurement result display section 424 provides no data.

When a measurement button in the condition section 423 is selected by the user, the system control unit 111 measures a temporal change of absorption current in the sample 200 under the preset basic observation condition (S103). Measurement time of absorption current is preset.

The system control unit 111 can adjust magnification and scan speed by controlling the scanning deflector 102, for example. The system control unit 111 can adjust acceleration voltage and probe current by controlling the electron gun 100. The system control unit 111 may control the aperture 104 in adjustment of probe current.

Figure 6B:
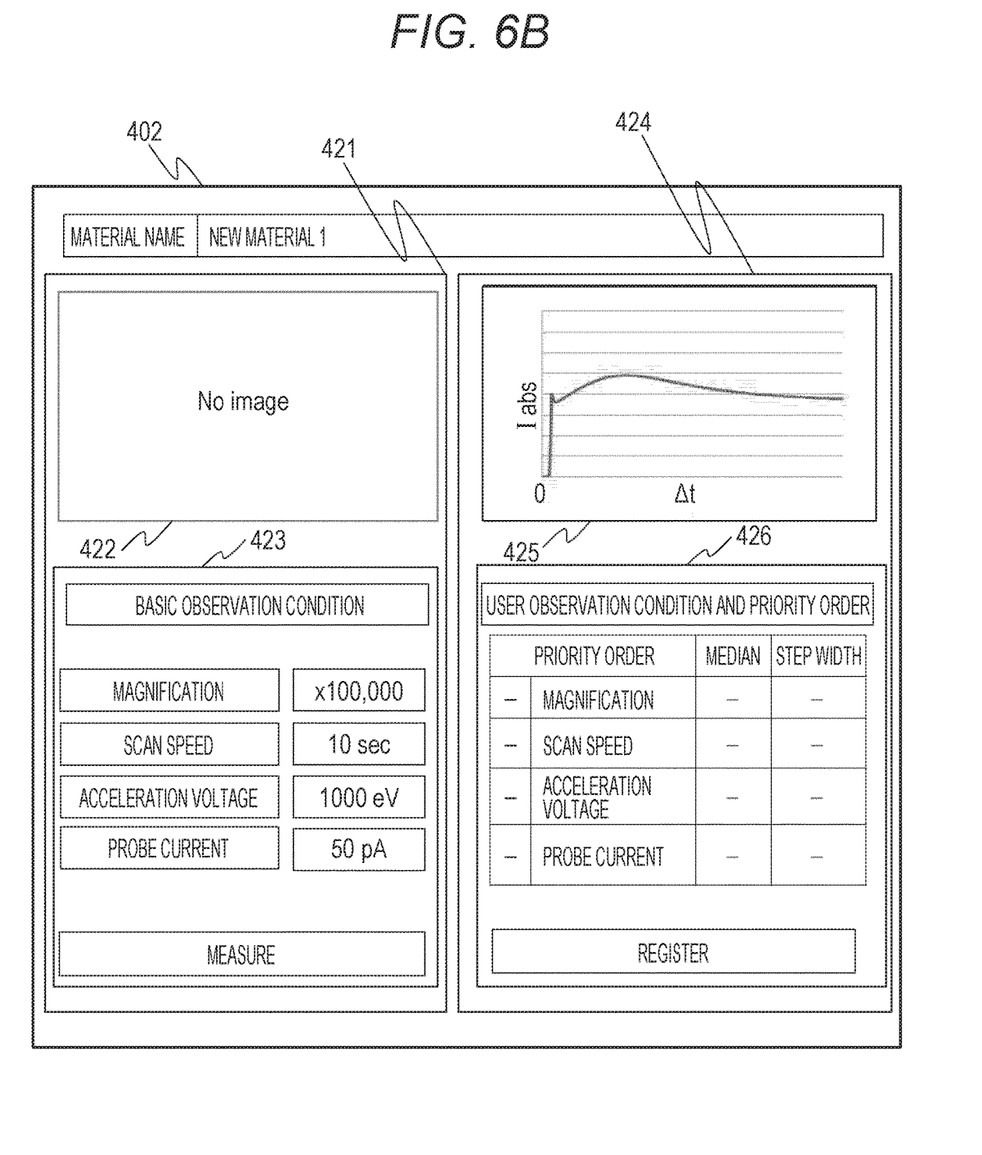
FIG. 6B illustrates an example of a GUI image for determining the observation condition.

The GUI image changes from FIG. 6A to FIG. 6B. The system control unit 111 displays a measurement result of the temporal change of the absorption current in the sample 200 on the measurement data section 425 of the window 402.

For measurement of a temporal change of absorption current, the system control unit 111 emits a primary electron beam to a different area from an actual observation area of the sample 200. The observation area is previously designated by the user, for example. A sample for observation and a sample for measurement of a temporal change of absorption current may be separated. The system control unit 111 registers in the database 113 the measurement result of the temporal change of the absorption current, the material name, and the parameter value set (S104).

On the other hand, in a case in which data of the observation target sample is registered in the database 113, that is, the material list 411 includes the target material (S101: YES), the user operates the user terminal 112 to select one material from the material list 411 (S105). The system control unit 111 receives the selection result from the user terminal 112.

As described above, the system control unit 111 determines in accordance with the user operation whether or not the target sample data is registered in the database 113. Meanwhile, the user terminal 112 may let the user input a target sample material and search the material in the database 113.

Subsequently, in step S106, the system control unit 111 displays on the user terminal 112 the basic observation condition and the measurement data of the temporal change of the absorption current in the target material under the basic observation condition (S106). The system control unit 111 acquires the data of the basic observation condition and the measurement data from the database 113, generates a GUI image, and transmits the GUI image to the user terminal 112. On the GUI image, the user inputs values for setting a new user observation condition (S107).

Figure 6C:
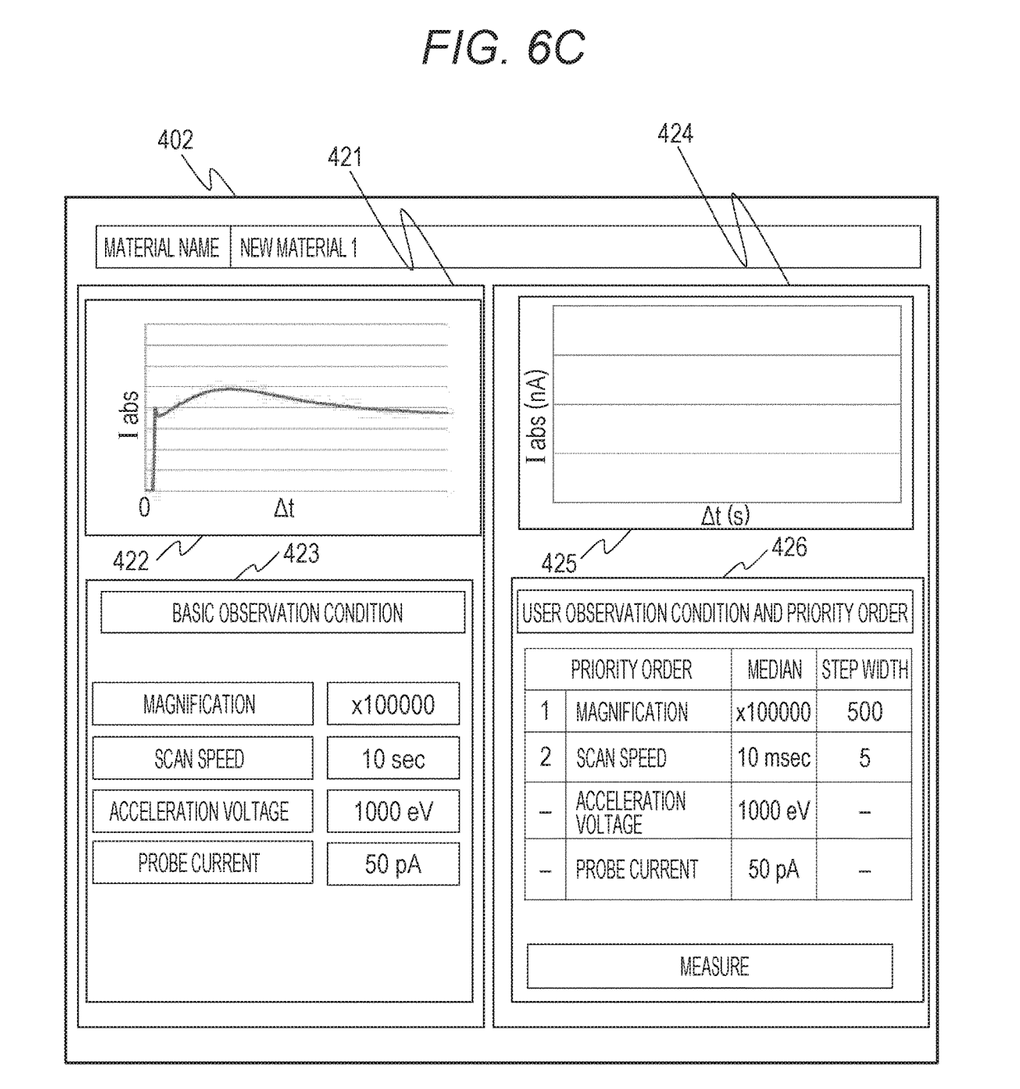
FIG. 6C illustrates an example of a GUI image for determining the observation condition.

FIG. 6C illustrates a GUI image in steps S106 and S107. The GUI image changes from FIG. 6B to FIG. 6C. In FIG. 6C, the observation condition section 426 includes a field in which the user is to input a condition for measuring a temporal change of absorption current.

The user selects parameters whose values are changed (variable parameters in measurement of a temporal change of absorption current) and parameters whose values are fixed (invariable parameters in measurement of a temporal change of absorption current) from the four parameters. In the example in FIG. 6C, acceleration voltage and probe current are selected as parameters whose values are fixed. The system control unit 111 sets values of the parameters whose values are fixed as values in the basic observation condition. The system control unit 111 may accept input of a fixed value by the user.

In the example in FIG. 6C, magnification and scan speed are selected as parameters whose values are changed. The user also determines priority order in the parameters whose values are changed. In the example in FIG. 6C, the priority of magnification is higher than the priority of scan speed. The user inputs a median and a step width of each of the parameters whose values are changed.

The system control unit 111 determines a minimum value and a maximum value (parameter variability range) of each of the parameters whose values are changed for measurement of a temporal change of absorption current based on the input median. A determination method is preset. For example, the system control unit 111 regards values obtained by increasing and decreasing the input median by a specified rate (for example, 20%) as the maximum value and the minimum value. The system control unit 111 changes the values of the parameters, using the input step widths.

In this manner, from the input median and step width for each parameter, a parameter value group consisting of a plurality of values is determined. Meanwhile, the step width may be determined by the system control unit 111. For example, the system control unit 111 regards a specified rate of the median as the step width. The system control unit 111 may accept input of a range of a parameter value instead of input of the median.

In the example in FIG. 6C, magnification and scan speed are selected as parameters whose values are changed. Thus, the system control unit 111 generates a group of magnification values and a group of scan speed values.

As illustrated in FIG. 6C, the user terminal 112 presents the measurement data of the temporal change of the absorption current on the measurement data section 422 and presents the parameter value set (basic observation condition) for the measurement on the condition section 423. This enables the user to determine a condition for measurement of a temporal change of absorption current with reference to the measurement data of the temporal change of the absorption current under the basic observation condition.

Returning to FIG. 3, the system control unit 111 measures a temporal change of absorption current in the sample 200 under respective different parameter value sets specified by the user (S108). Thus, actual measurement data of the sample 200 can be acquired. In a case in which one parameter is to be changed, the system control unit 111 measures a temporal change of absorption current under respective parameter value sets each consisting of each value of the parameter and fixed values of the other parameters.

In a case in which a plurality of parameters are to be changed, the system control unit 111 measures a temporal change of absorption current under all combinations using all values of the plurality of parameters that are to be changed. In the example in FIG. 6C, magnification and scan speed are variable parameters in measurement of a temporal change of absorption current. Accordingly, the system control unit 111 generates all different pairs each consisting of each of the magnification values and each of the scan speed values and measures a temporal change of absorption current under each parameter value set consisting of each pair and fixed values of acceleration voltage and probe current.

However, the system control unit 111 omits measurement of a temporal change of absorption current under a sample material and a measurement condition that are already registered in the database 113. This reduces time for measurement of a temporal change of absorption current. The system control unit 111 may measure a temporal change of absorption current under all parameter value sets regardless of whether or not measurement data under the same material and same condition exists in the database 113.

The system control unit 111 registers measurement data under each parameter value set as well as data of the corresponding measurement condition and sample material in the database 113 (S110). In a case in which measurement data under the same material and same condition exists in the database 113, the system control unit 111 writes new data on old data or adds new data to the database 113.

Subsequently, the system control unit 111 determines an optimal parameter value set based on the measurement results of the temporal change of the absorption current (S109). In observation of a sample, it is important for a change of an influence of contamination to be small. Thus, the system control unit 111 regards a parameter value set in which the changing amount of absorption current is small as a parameter value set appropriate to observation of the sample.

As described with reference to FIG. 2, in many samples, the absorption current amount increases, decreases, and increases again as time passes in accordance with attachment and removal of contamination. In one example, the system control unit 111 regards a difference between two extreme values in the temporal change of the absorption current amount as the changing amount of the absorption current under the parameter value set.

In another example, the system control unit 111 defines a window having a specified size (time length). The system control unit 111 moves the window on the graph of the temporal change of the absorption current amount and calculates each difference between a maximum value and a minimum value in the window. The system control unit 111 regards the lowest difference calculated as the changing amount of the absorption current amount under the parameter value set.

The window size is determined based on a value of scan speed that is preset or that is in the parameter value set. For example, the window size is equal to or is the integral multiple of the value of scan speed. The window size may be equal to the measurement time of the absorption current. The window size may be specified by the user. In determination of the absorption current changing amount, the system control unit 111 eliminates noise from the measurement data of the absorption current with use of a low-pass filter, for example, as needed.

The system control unit 111 may use a ratio as the changing amount of the absorption current. For example, the system control unit 111 may calculate as the changing amount of the absorption current amount a ratio of the changing amount to an average value of measurement values of the absorption current and select a parameter value set based on the ratio value.

For example, the system control unit 111 selects a parameter value set in which the changing amount of the absorption current amount is the smallest. Alternatively, the system control unit 111 may select a parameter value set in which a parameter whose priority is the highest shows the best value from parameter value sets in each of which the changing amount of the absorption current amount is within a preset specified range. For example, a higher magnification value is more preferable, a slower (longer) scan speed value is more preferable, and a lower acceleration voltage value and a lower probe current value are more preferable.

In comparison of scan speed with a measurement value of a temporal change of absorption current, the system control unit 111 may compare time at which the minimum value of the absorption current amount is shown (time T_B in FIG. 2) with scan speed. For example, the system control unit 111 selects a parameter value set in which scan speed is time at which the minimum value of the absorption current amount is shown. Thus, a parameter value set including scan speed less influenced by contamination can be selected. For example, the system control unit 111 selects a parameter value set including scan speed that is the longest in the above range.

In a case in which a plurality of priority parameters are specified by the user, the system control unit 111 selects parameter value sets in each of which a value of the highest priority parameter among specified parameters shows the best value, and in each of which the measurement value of the temporal change of the absorption current is within the specified range, for example. The system control unit 111 selects a parameter value set in which a low priority parameter also shows the best value from among the selected parameter value sets.

A best parameter value set is a parameter value set in which the changing amount of the absorption current is minimum or a parameter value set in which the changing amount of the absorption current is within the specified range and in which the parameter values are the best, for example.

As in the example illustrated in FIG. 6C, in a case in which scan speed is specified as a priority parameter, the system control unit 111 may select a parameter value set in the following manner. The system control unit 111 selects parameter value sets in each of which scan speed is shorter than time at which the absorption current amount shows the minimum value. The system control unit 111 further selects a parameter value set in which a magnification value is the best from among the selected parameter value sets.

In a case of a material, such as Au, to which contamination hardly attaches, the temporal change of the absorption current may not show extreme values and show a monotonous change. In this case, the system control unit 111 calculates a difference of the absorption current values within a measurement time range or within a window. In the case of the material in which the temporal change of the absorption current shows a monotonous change, the system control unit 111 may select a parameter value set in which a statistical value of the measurement value of the absorption current amount, such as an average value and a measurement minimum value of the absorption current, is low. This method is effective in a case in which the absorption current amount shows a monotonous change, and in which the absorption current amount change depending on a material is small.

Figure 6D:
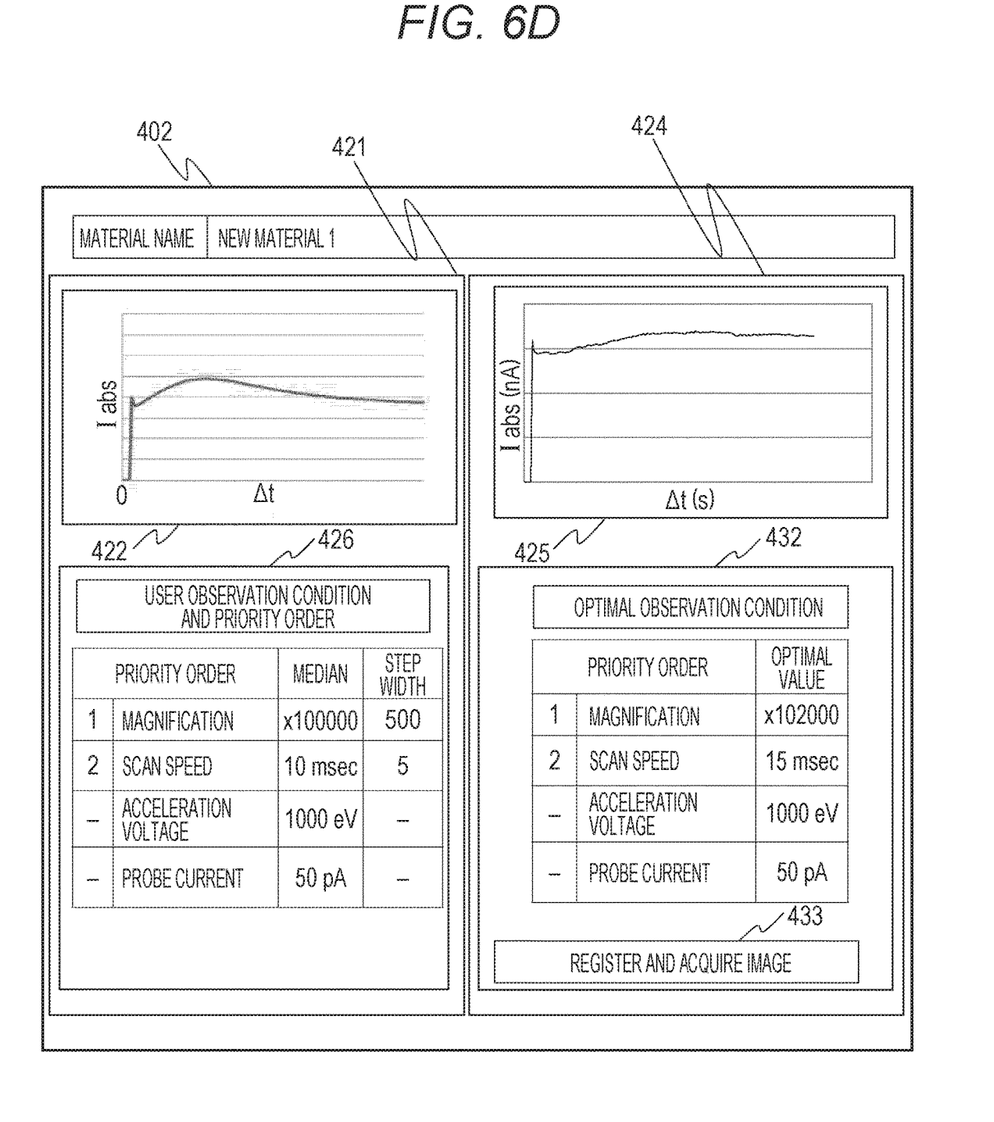
FIG. 6D illustrates an example of a GUI image for determining the observation condition.

Subsequently, the system control unit 111 displays the selected optimal parameter value set and the absorption current measurement data on the user terminal 112 (S111). FIG. 6D illustrates an example of a GUI image illustrating data of the optimal parameter value set. The GUI image changes from FIG. 6C to FIG. 6D. In FIG. 6D, the database data section 421 includes the observation condition section 426. The measurement result display section 424 shows an optimal observation condition section 432 instead of the observation condition section 426 in FIG. 6C.

The optimal observation condition section 432 shows the selected optimal parameter value set. The measurement data section 425 shows the measurement data of the temporal change of the absorption current under the measurement condition (parameter value set) shown in the optimal observation condition section 432. The absorption current data under the basic observation condition and the absorption current data under the recommended observation condition are shown to assist the user in determining whether or not the user accepts the recommended parameter value set.

When the user selects a button 433, the system control unit 111 registers the data of the parameter value set in the database 113 (S110). Thereafter, in accordance with a user's instruction, the system control unit 111 executes observation of the sample 200 (generation of image data) under the primary electron beam irradiation condition using the optimal parameter value set (S112).

In a case in which the window is used in selection of the optimal parameter value set, the measurement data section 425 may show the window. Also, the optimal observation condition section 432 may show start time and end time of the window. In step S112, the system control unit 111 starts irradiation with the primary electron beam and then acquires image data of the sample 200 in the window. Accordingly, the image data of the sample 200 can be acquired in the condition and the time period less influenced by contamination.

The system control unit 111 may accept designation of image acquisition time from the user. For example, the system control unit 111 starts acquisition of the image data at specified time. Accordingly, the image data can be acquired at the time at which the absorption current is less influenced as the user desires.

Even in a case in which the highest priority variable parameter is acceleration voltage, scan speed, or probe current, the system control unit 111 can determine from the temporal change of the absorption current the condition including acceleration voltage, scan speed, or probe current least influenced by contamination with use of the above method.

As described above, by sequentially comparing measurement results of the temporal change of the absorption current by changing the primary electron beam irradiation condition and finding a condition for restricting the value of the absorption current, an observation condition less influenced by contamination can be provided to the user.

The present invention is not limited to the foregoing embodiments and includes various modification examples. For example, the foregoing embodiments have been described in detail to facilitate understanding of the present invention, and the present invention is not limited to one including all of the components described herein. Also, some components of one embodiment can be substituted with components of another embodiment, and components of another embodiment can be added to components of one embodiment. Further, some components of each embodiment can be added, deleted, and substituted with other components.

Also, each of the above components, functions, processing units, and the like may partially or entirely be fulfilled by hardware by designing it in the form of an integrated circuit. Also, each of the above components, functions, and the like may be fulfilled by software by letting a processor interpret and execute a program fulfilling each of the functions. Data of the program, a table, a file, and the like fulfilling each of the functions can be stored in a recording device such as a memory, a hard disk, and an SSD (Solid State Drive) or a recording medium such as an IC card and an SD card. Also, control lines and data lines that are thought of as necessary in the description are illustrated, and not all control lines and data lines provided on an actual product are illustrated. Actually, it may be thought of that most of the components are connected to each other.

What is claimed is:

1. A scanning microscope comprising:
a charged particle beam source configured to output a charged particle beam to be emitted to a sample;
a detector configured to detect charged particles from the sample; and
a controller configured to control the charged particle beam source and the detector, wherein
the controller changes one or more variable parameters to determine a plurality of different parameter value sets, acquires a measurement result of a temporal change of absorption current in a target sample material under each of the plurality of different parameter value sets, and, based on the measurement results, selects a parameter value set for use in measurement of a target sample from the plurality of different parameter value sets.

2. The scanning microscope according to claim 1, wherein:
in accordance with user input, the controller selects the one or more variable parameters from a plurality of variable parameters, changes the one or more variable parameters, fixes parameters other than the one or more variable parameters, and generates the plurality of different parameter value sets.

3. The scanning microscope according to claim 2, wherein:
the plurality of variable parameters include magnification, scan speed, acceleration voltage, and probe current.

4. The scanning microscope according to claim 1, wherein:
the controller measures a temporal change of absorption current in the target sample under each of the plurality of different parameter value sets and acquires measurement results of the temporal change of the absorption current in the target sample material.

5. The scanning microscope according to claim 1, further comprising:
a database configured to store measurement data of absorption current under the plurality of parameter value sets, wherein
the controller acquires a measurement result of a temporal change of absorption current in the target sample material under a parameter value set included in the plurality of different parameter value sets.

6. The scanning microscope according to claim 1, further comprising:
a database configured to store measurement data of absorption current under the plurality of parameter value sets, wherein,
in a case in which the database stores a measurement result of a temporal change of absorption current in the target sample material under a parameter value set included in the plurality of different parameter value sets, the controller acquires the measurement result from the database, and,
in a case in which the database does not store a measurement result of a temporal change of absorption current in the target sample material under a parameter value set, the controller measures a temporal change of absorption current in the target sample under the parameter value set.

7. The scanning microscope according to claim 5, wherein:
the controller stores the measurement result of the temporal change of the absorption current in the target sample in the database.

8. The scanning microscope according to claim 1, wherein:
the controller selects the parameter value set for use based on a changing amount of the absorption current in the target sample material under each of the plurality of different parameter value sets.

9. The scanning microscope according to claim 8, wherein:
the controller determines the changing amount of the absorption current based on a maximum value and a minimum value in the temporal change of the absorption current.

10. The scanning microscope according to claim 1, wherein:
the one or more variable parameters include a first variable parameter, and
the controller determines a changing amount of the absorption current in the target sample material under each of different values of the first variable parameter and selects a parameter value set including a value of the first variable parameter the changing amount of which is the smallest as the parameter value set for use in measurement of the target sample.

11. The scanning microscope according to claim 1, wherein:
the one or more variable parameters include scan speed, and
the controller selects a parameter value set in which a value of the scan speed is time representing a minimum value of an absorption current amount in a temporal change of absorption current in the target sample material as the parameter value set for use in measurement of the target sample.

12. A method for determining a parameter value set in a scanning microscope, the scanning microscope including a charged particle beam source configured to output a charged particle beam to be emitted to a sample, and a detector configured to detect charged particles from the sample, the method comprising:
changing one or more variable parameters to determine a plurality of different parameter value sets;
acquiring a measurement result of a temporal change of absorption current in a target sample material under each of the plurality of different parameter value sets; and
based on the measurement result, selecting a parameter value set for use in measurement of a target sample from the plurality of different parameter value sets.

\* \* \* \* \*